(12) United States Patent
Ihara et al.

(10) Patent No.: US 6,281,171 B1
(45) Date of Patent: Aug. 28, 2001

(54) MG-DOPED HIGH-TEMPERATURE SUPERCONDUCTOR HAVING THE SUPERCONDUCTING ANISOTROPY AND METHOD FOR PRODUCING THE SUPERCONDUCTOR

(75) Inventors: Hideo Ihara, Tsukuba (JP); Shyam Kishore Agarwal, New Delhi (IN)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 0 days.

(21) Appl. No.: 09/270,682

(22) Filed: Mar. 16, 1999

(30) Foreign Application Priority Data

Mar. 27, 1998 (JP) .................................................. 10-122631

(51) Int. Cl.$^7$ .......................... C04B 35/04; C04B 35/50; H01B 12/00
(52) U.S. Cl. .......................... 505/125; 505/776; 505/779
(58) Field of Search ................................... 505/125, 776, 505/779

(56) References Cited

FOREIGN PATENT DOCUMENTS

11278837 * 10/1999 (JP) .

OTHER PUBLICATIONS

Agarwal et al. "Superconductivity in Mg–doped CuBa2Ca3Cu4O$_{12-y}$," Phys. Rav. B.: Cadeus. Matter mater. Phys (Oct., 1998) [Abstract].*

Tokiwa et al. "Pressure effects on resistive transition in (Cu,M)Ba2Ca3Cu4Oy" J. Low Temp Phys (1999), 117, 3(19) [Abstract].*

* cited by examiner

Primary Examiner—Mark Kopec
(74) Attorney, Agent, or Firm—Oblon, Spivak, McClelland, Maier & Neustadt, P.C.

(57) ABSTRACT

A Mg-doped high-temperature superconductor having low superconducting anisotropy includes a two-dimensional layered structure constituted by a charge reservoir layer and a superconducting layer, wherein some or all atoms constituting the charge reservoir layer are Cu and O atoms, metallizing or rendering the charge reservoir layer superconducting, a portion of the Ca of the $Cu_nCa_{n-1}O_{2n}$ constituting the superconducting layer is replaced by Mg, increasing superconductive coupling between $CuO_2$ layers, a thickness of the superconducting layer is increased, and therefore coherence length in a thickness direction is increased based on the uncertainty principle, lowering superconducting anisotropy.

4 Claims, 10 Drawing Sheets

MG-DOPED HIGH-TEMPERATURE SUPERCONDUCTOR HAVING THE SUPERCONDUCTING ANISOTROPY AND METHOD FOR PRODUCING THE SUPERCONDUCTOR

BACKGROUND OF THE INVENTION

1. Field of the Invention

The present invention relates to a high-temperature superconductor that has very low superconducting anisotropy, a high superconducting transition temperature (Tc), a high critical current density (Jc), a high irreversible field (Hirr), and a long coherence length ξ in a direction perpendicular to the plane (the direction being the c-axis direction, the intrafacial plane the ab-axis), and to a method for producing the superconductor.

2. Description of the Prior Art

A high Tc has been considered to be closely related to high superconducting anisotropy (two-dimensionality) of superconducting properties. Known high-temperature superconductors having a two-dimensional layered structure comprised of charge reservoir layers and superconducting layers include Y, Bi, Tl, and Hg based copper oxide superconductors. However, owing to the high superconducting isotropy of these superconductors, at 77 K they do not have a sufficiently high superconductivity, impeding progress toward their practical application at liquid nitrogen temperatures.

In existing superconductors having a layered structure, owing to the large radius of the Ca ions in the $Cu_nCa_{n-1}O_{2n}$ of the superconducting layers the superconductive coupling between the $CuO_2$ layers is low. Moreover, because in these superconductors having a layered structure the charge reservoir layer is an insulation layer or non-superconducting layer with low superconductive coupling in the c-axis direction and, therefore, the interactive effect between superconducting layers is small, in addition to which owing to the thinness of the superconducting layers, superconducting anisotropy γ is large, being in the order of 5 to 300 (γ defined as the ratio of the coherence length, the square root of the electron effective mass ratio, or magnetic field penetration depth ratio, is $γ=ξab/ξc=(mc/mab)^{1/2}=λc/λab$).

As such, the Jc, especially the Jc under a high magnetic field, and the Hirr, the upper limit of the magnetic field at which zero electrical resistance is generates, become small, posing many problems to the practical use as wire or bulk superconducting material. Furthermore, the large superconducting anisotropy means that the (Jc)c in the c-axis direction is small and the coherence length ξc in the c-axis direction also is small, so that when used as a superconducting device material, the properties of the layered structure superconducting device are not adequate, especially the Josephson current density.

An object of the present invention is to provide a high-temperature superconductor that is low in superconducting anisotropy, and a method for producing the superconductor.

SUMMARY OF THE INVENTION

In accordance with the present invention, the above object is attained by providing a Mg-doped high-temperature superconductor having low superconducting anisotropy, comprising a two-dimensional layered structure constituted by a charge reservoir layer and a superconducting layer, wherein some or all atoms comprising the charge reservoir layer are Cu, O atoms, metallizing or rendering the charge reservoir layer superconducting, a portion of Ca of $Cu_nCa_{n-1}O_{2n}$ constituting the superconducting layer is replaced by Mg, increasing superconductive coupling between $CuO_2$ layers, a thickness of the superconducting layer is increased, and therefore coherence length in a thickness direction is increased based on the Uncertainty principle, lowering superconducting anisotropy.

The Mg-doped high-temperature superconductor having low superconducting anisotropy may be produced by a method comprising supplying a superconductor comprising $Cu_{1-x}M_x(Ba_{1-y}Sr_y)_2(Ca_{1-z}Mg_z)_{n-1}Cu_nO_{2n+4-w}$ (in which M is one or more selected from the group consisting of Tl, Hg, Bi, Pb, Au, In, Sn, Mg, Ag, Mo, Re, Os, Cr, V, Fe, and lanthanide elements, $0≦x<1$, $0≦y<1$, $0≦z<1$, $0≦w≦4$, and $3≦n≦16$), or $Cu_{1-x}M_x(Ba_{1-y-m}Sr_yR_m)_2(Ca_{1-z}Mg_z)_{n-1}Cu_nO_{2n+4-w}$ (in which M is one or more selected from the group consisting of Tl, Hg, Bi, Pb, Au, In, Sn, Mg, Ag, Mo, Re, Os, Cr, V, Fe, and lanthanide elements, R is one or more selected from the group consisting of La, Ce, Pr, Nd, Pm, Sm, Eu, Gd, Tb, Dy, Ho, Er, Tm, Yb and Lu, with $0≦m<1$, $0≦y+m≦1$, $0≦x<1$, $0≦y<1$, $0<z<1$, $0≦w≦4$, and $3≦n≦16$) or the starting materials thereof onto a single-crystal substrate or crystal-oriented substrate, sealing the substrate in an oxidation resistant capsule and applying a pressure of at least one atmosphere to synthesize bulk or single-crystal superconducting materials having a high critical current density Jc aligned along at least the a-axis and c-axis.

The Mg-doped high-temperature superconductor having low superconducting anisotropy according to the present invention may also be produced by a method comprising depositing or applying the above superconductor or superconductor starting material on a single-crystal substrate or crystal-oriented film substrate, sealing them in an oxidation resistant capsule to obtain a single-crystal or crystal oriented film aligned at least along the a-axis and c-axis having a high critical current density Jc.

Thus, in the superconductor of this invention, a portion of the Ca of the $Cu_nCa_{n-1}O_{2n}$ constituting the superconducting layer is replaced by Mg, which has a small ion radius, thereby increasing the superconductive coupling between the $CuO_2$ layers, a thickness of the superconducting layer is increased, and therefore superconducting anisotropy is lowered based on the uncertainty principle.

The above and other features of the present invention will beck apparent from the following description made with reference to the drawings.

DESCRIPTION OF THE PREFERRED EMBODIMENT

Figure 1:
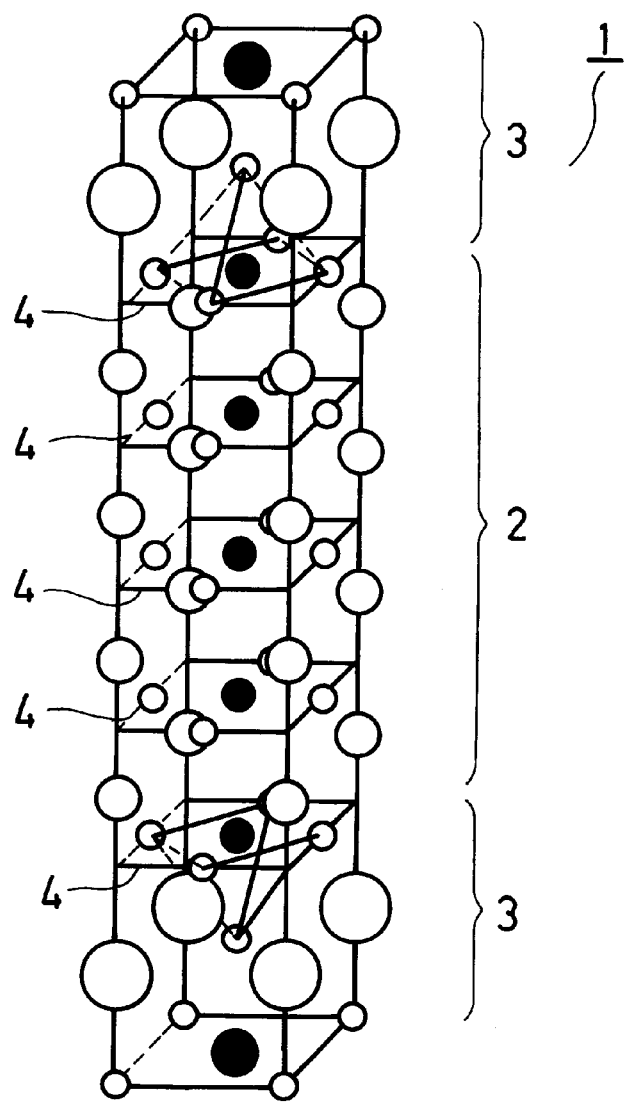
FIG. 1 is a diagram showing an example of a model of a crystal of an Mg-doped high-temperature superconductor having low anisotropy according to this invention.
Figure 1:
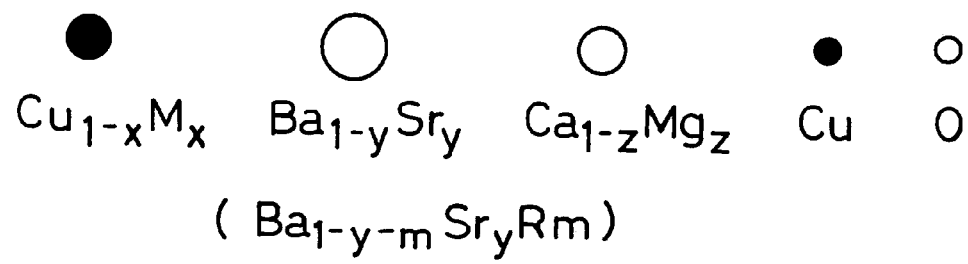

FIG. 1 is a diagram showing an example of a model of a crystal of the Mg-doped high-temperature superconductor having low anisotropy of this invention. With reference to the drawing, a unit cell model 1 comprises a pair of charge reservoir layers 3 provided along the c-axis and a superconducting layer 2 interposed between the layeres 3. The superconducting layer 2 has a plurality of $CuO_2$ planes 4. In accordance with this invention, a portion of the Ca of the $Cu_nCa_{n-1}O_{2n}$ constituting the superconducting layer is replaced by Mg, which has a small ion radius, thereby increasing the superconductive coupling between the $CuO_2$ planes. Also, by increasing a thickness of the superconducting layer having a layered structure by increasing the number n of constituent superconducting layers, the superconducting electron uncertainty region in the c-axis is expanded in the thickness direction, making it possible to increase the coherence length $\xi c$ in the c-axis direction, allowing the superconducting anisotropy γ to be reduced to a very low level.

Moreover, some or all of the atoms constituting the charge reservoir layer 3 are replaced with copper and oxygen atoms giving superconductivity to metallize or render the charge reservoir layer superconducting. However, based on another conclusion derived from the uncertainty principle, since the superconduction coherence length is proportional to the Fermi velocity $V_F$, metallizing the charge reservoir layer or rendering it superconducting enlarges the $V_F$ component in the c-axis direction, which, increases the coherence length $\xi c$, thus enabling the superconducting anisotropy to be reduced.

A copper oxide represented by the formula $Cu_{1-x}M_x(Ba_{1-y}Sr_y)_2(Ca_{1-z}Mg_z)_{n-1}Cu_nO_{2n+4-w}$ (in which M is one or more selected from the group consisting of Tl, Hg, Bi, Pb, Au, In, Sn. Mg, Ag, Mo, Re, Os, Cr, V, Fe, and lanthanide elements, $0 \leq x<1, 0 \leq y<1, 0<z<1, 0 \leq w \leq 4$, and $3 \leq n \leq 16$) can be cited as an example of a preferred composition for the superconductor of this invention having a two-dimensional layered structure.

Another example of a preferred composition for the superconductor is the following copper oxide in which part of the Ba in the above composition is replaced by a lanthanide element (R), represented by the formula $Cu_{1-x}M_x(Ba_{1-y-m}Sr_yR_m)_2(Ca_{1-z}Mg_z)_{n-1}Cu_nO_{2n+4-w}$ (in which M is one or more selected from the group consisting of Tl, Hg, Bi, Pb, Au, In, Sn, Mg, Ag, Mo, Re, Os, Cr, V, Fe, and lanthanide elements, R is one or more selected from the group consisting of La, Ce, Pr, Nd, Pm, Sm, Eu, Gd, Tb, Dy, Ho, Er, Tm, Yb and Lu, with $0 \leq m<1, 0 \leq y+m \leq 1, 0 \leq x<1, 0 \leq y<1, 0<z<1, 0 \leq w \leq 4$, and $3 \leq n \leq 16$).

In the case of these copper oxide superconductors, the coupling between the charge reservoir layer and the superconducting layer of the superconductor is strengthened by increasing the number n of $(Ca_{1-z}Mg_z)_{n-1}Cu_nO_{2n}$ layers, metallizing the $Cu_{1-x}M_x(Ba_{1-y}Sr_y)_2O_{2n+4-w}$ or $Cu_{1-x}M_x(Ba_{1-y-m}Sr_yR_m)_2O_{2n+4-w}$ charge reservoir layer bonded to the superconductor layer, and also by the original, intrinsic superconductivity of the charge reservoir layer. As a result, the superconducting electron uncertainty region (thickness) in the c-axis direction is enlarged, increasing the coherence length $\xi c$ and decreasing superconducting anisotropy.

In the case of some copper oxide superconductors, the coherence length $\xi c$ can be empirically expressed as $\xi c=0.32$ (n−1) nm, $\xi ab=1.6$ nm, giving superconducting anisotropy $\gamma=\xi ab/\xi c=5/(n-1)$, so in the case of superconductors in which n is three or more, if the carrier concentration is sufficient a superconducting anisotropy of $\gamma<4$ can be realized.

Furthermore, with respect to the above copper oxide superconductors, the average valence number of the copper can be expressed as $Z=2+(4-2w)/(n+1)<2+4/(n+1)$, and from n=1 to 16, Z will be not less than 2.25, so that decreasing the oxygen vacancy concentration w enables a sufficient carrier supply to realize a superconducting anisotropy of $\gamma<4$.

The above-described low anisotropy, high-temperature superconductor may be prepared by a known non-equilibrium method such as high-pressure synthesis, hot pressing, HIP (high-temperature isostatic processing), sealing in an oxidation resistant material, sputtering or laser ablation. The sputtering target may be a sintered material having the same composition as the superconductor to be produced, or a target may be used formed of each of the elements to be laminated in atomic layers. Sputtering or laser-ablation is performed using, for example, single-crystal substrate of $SrTiO_3$, $NdGaO_3$, $LaAlO_3$, YSZ (Y stabilized $ZrO_2$), or $LaSrCaO_4$ or the like at a substrate temperature of 300 to 800° C. and an oxygen pressure of 0.01 to 1 Torr.

The low anisotropy, high-temperature superconductor according to the present invention is characterized by a structure comprised by depositing or applying the above superconductor comprising $Cu_{1-x}M_x(Ba_{1-y}Sr_y)_2(Ca_{1-z}Mg_z)_{n-1}Cu_nO_{2n+4-w}$ (in which M is one or more selected from the group consisting of Tl, Hg, Bi, Pb, Au, In, Sn, Mg, Ag, Mo, Re, Os, Cr, V, Fe, and lanthanide elements, $0 \leq x<1$, $0 \leq y<1$, $0 \leq z<1$, $0 \leq w \leq 4$, and $3 \leq n \leq 16$), or $Cu_{1-x}M_x(Ba_{1-y-m}Sr_yR_m)_2(Ca_{1-z}Mg_z)_{n-1}Cu_nO_{2n+4-w}$ (in which M is one or more selected from the group consisting of Tl, Hg, Bi, Pb, Au, In, Sn, Mg, Ag, Mo, Re, Os, Cr, V, Fe, and lanthanide elements, R is La, Ce, Pr, Nd, Pm, Sm, Eu. Gd, Tb, Dy, Ho, Er, Tm, Yb or Lu, with $0 \leq m<1$, $0 \leq y+m \leq 1$, $0 \leq x<1$, $0 \leq y<1$, $0<z<1$, $0 \leq w \leq 4$, and $3 \leq n \leq 16$), or the starting materials of the superconductor, on a single-crystal substrate or crystal oriented film substrate which is then sealed in an oxidation resistant to obtain a single-crystal or crystal oriented film aligned at least along the a-axis and c-axis with a high critical current density Jc.

The low anisotropy, high-temperature superconductor or the starter materials thereof may also by supplied onto the single-crystal substrate or crystal-oriented film substrate which is then sealed in a gold, silver, Inconel, Hastelloy, alumina, AlN, BN or other such oxidation resistant metal or ceramics capsule and a pressure of at least one atmosphere applied to synthesize bulk or single-crystal superconducting materials having a high critical current density Jc aligned along at least the a-axis and c-axis.

The following examples describe preferred embodiments of this invention. However, it is to be understood that the invention is not limited to the embodiments but can also be constituted in various other configurations so long as these do not depart from the defined scope of the invention.

EXAMPLES

Figure 2A:
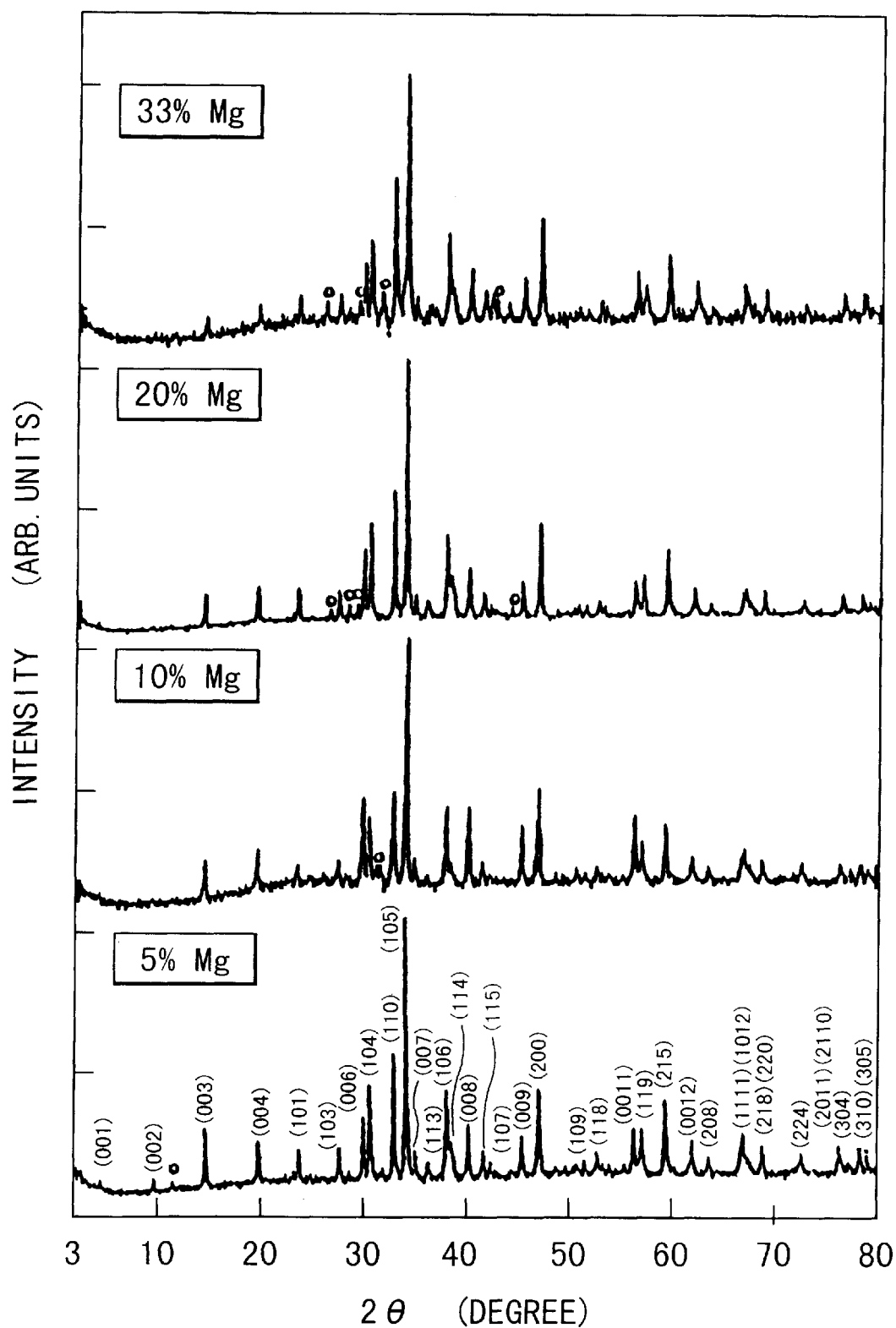
FIG. 2(a) is an x-ray diffraction pattern of an Mg-doped Cu-1234 $[Cusa_2(Ca_{1-z}Mg_z)_3Cu_4O_{12-w}]$ (z=0.05, 0.1, 0.2, 0.33) non-oriented powder sample.
Figure 2B:
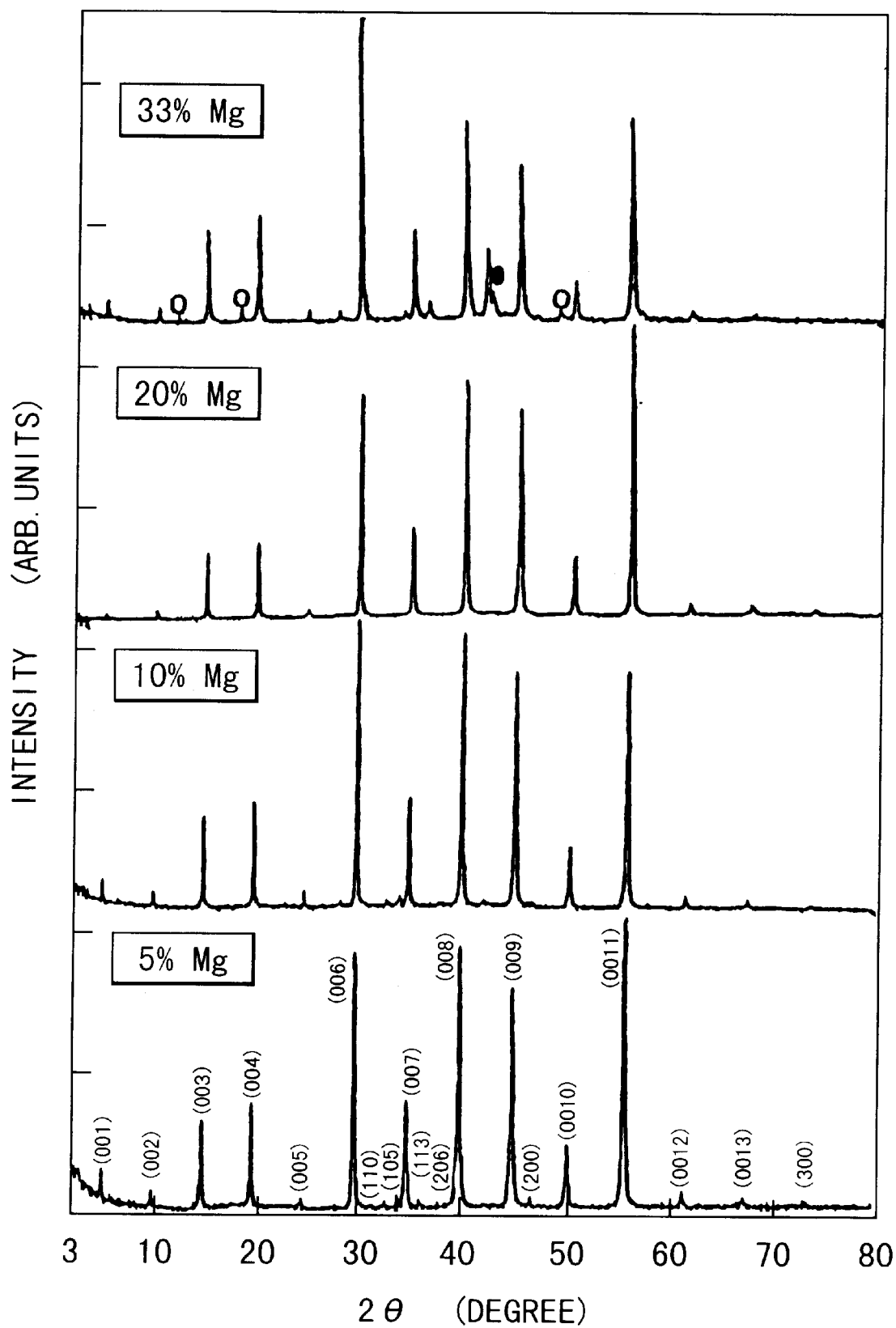
FIG. 2(b) is an x-ray diffraction pattern of an Mg-doped Cu-1234 (z=0.05, 0.1, 0.2, 0.33) powder sample that has been given a c-axis orientation.
Figure 3A:
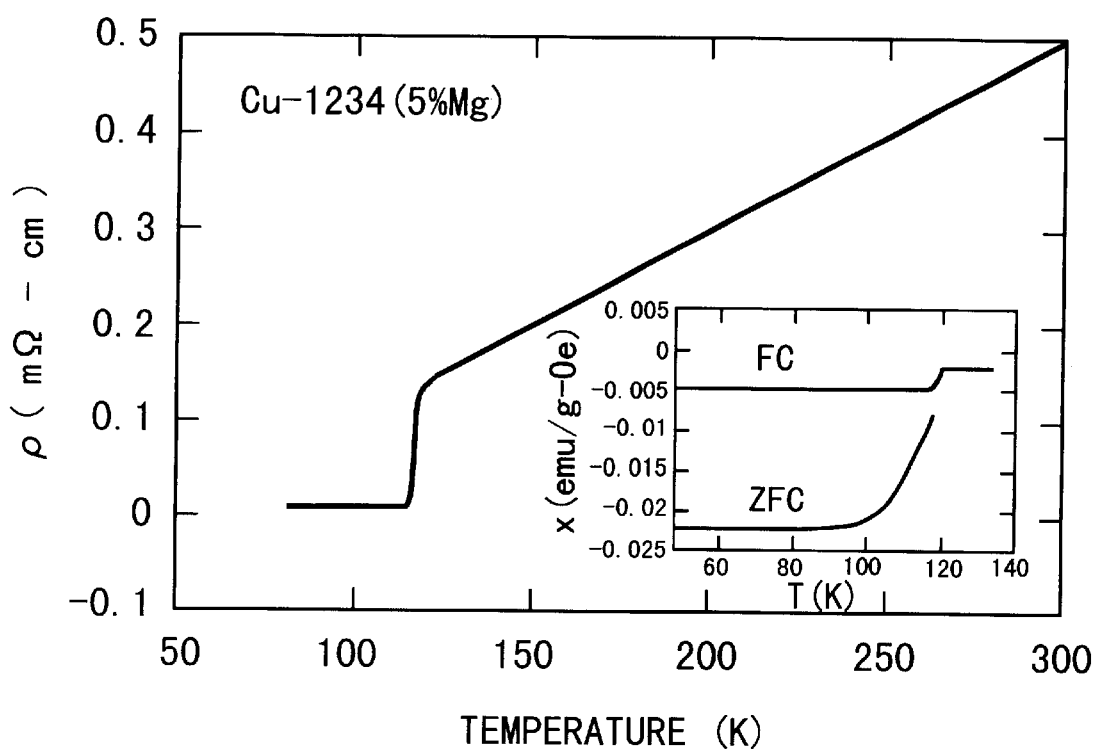
FIG. 3(a) is a diagram showing the relationship between temperature and the electrical resistivity and magnetic susceptibility ratio of Cu-1234 $[CuBa_2(Ca_{1-z}Mg_z)Cu_4O_{12-w}]$ in which the Mg concentration is 5%.
Figure 3B:
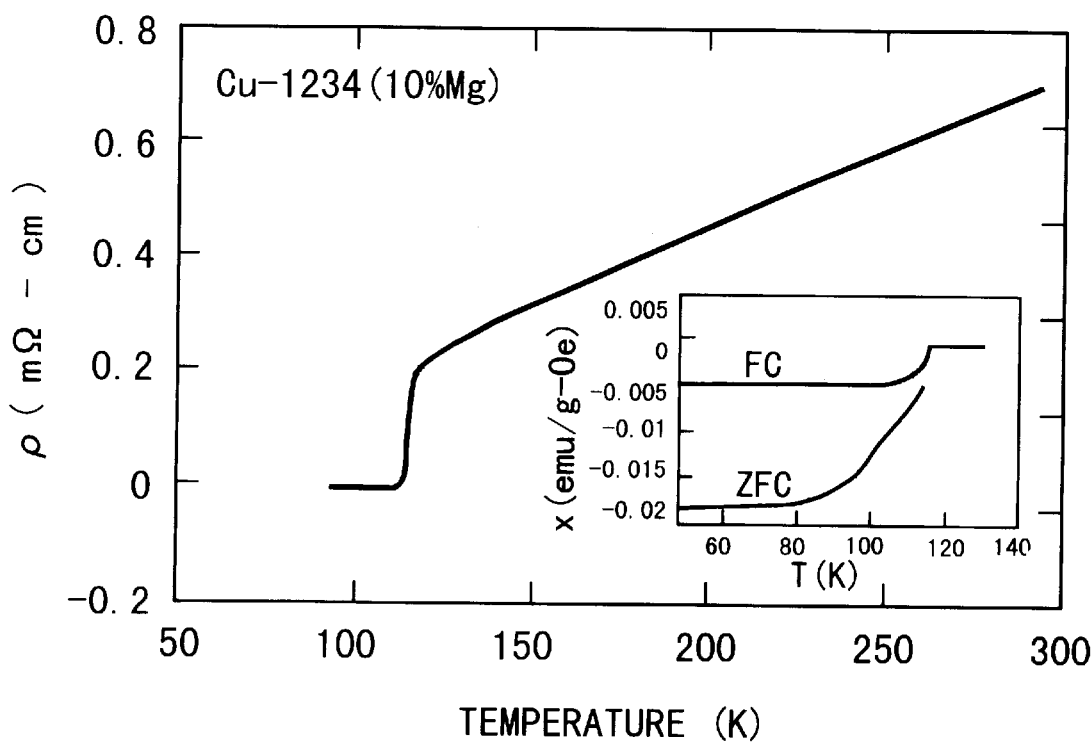
FIG. 3(b) is a diagram showing the relationship between temperature and the electrical resistivity and magnetic susceptibility ratio of Cu-1234 in which the Mg concentration is 10%.
Figure 3C:
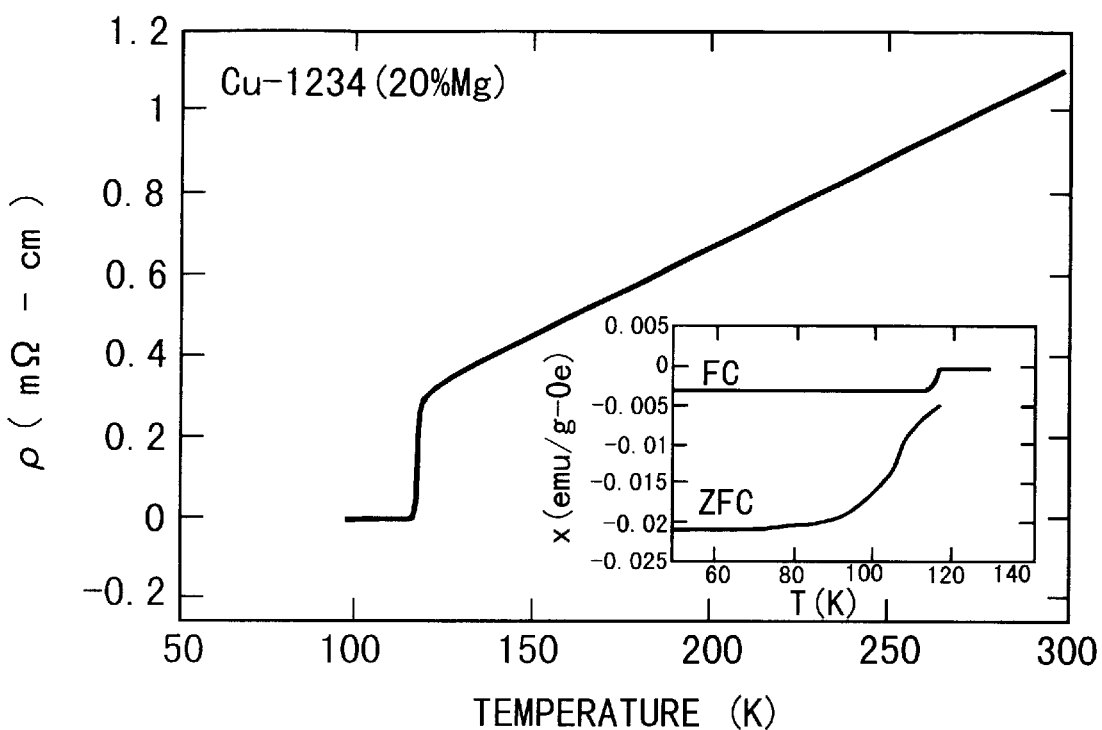
FIG. 3(c) is a diagram showing the relationship between temperature and the electrical resistivity and magnetic susceptibility ratio of Cu-1234 in which the Mg concentration is 20%.
Figure 3D:
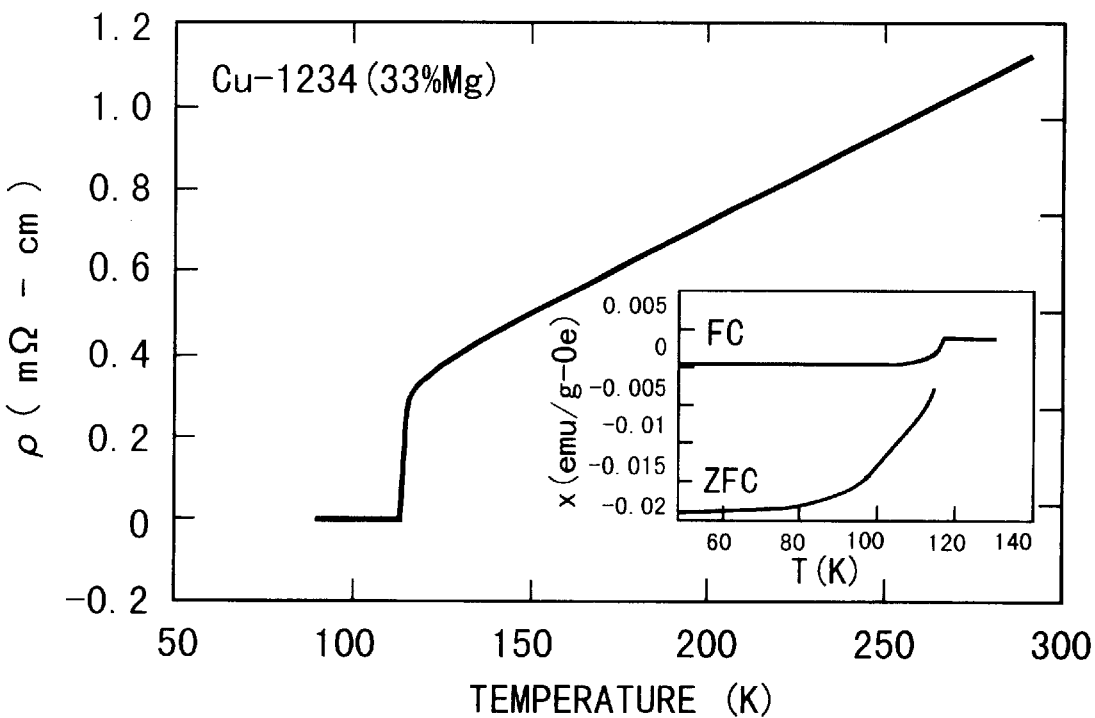
FIG. 3(d) is a diagram showing the relationship between temperature and the electrical resistivity and magnetic susceptibility ratio of Cu-1234 in which the Mg concentration is 33%.
Figure 4A:
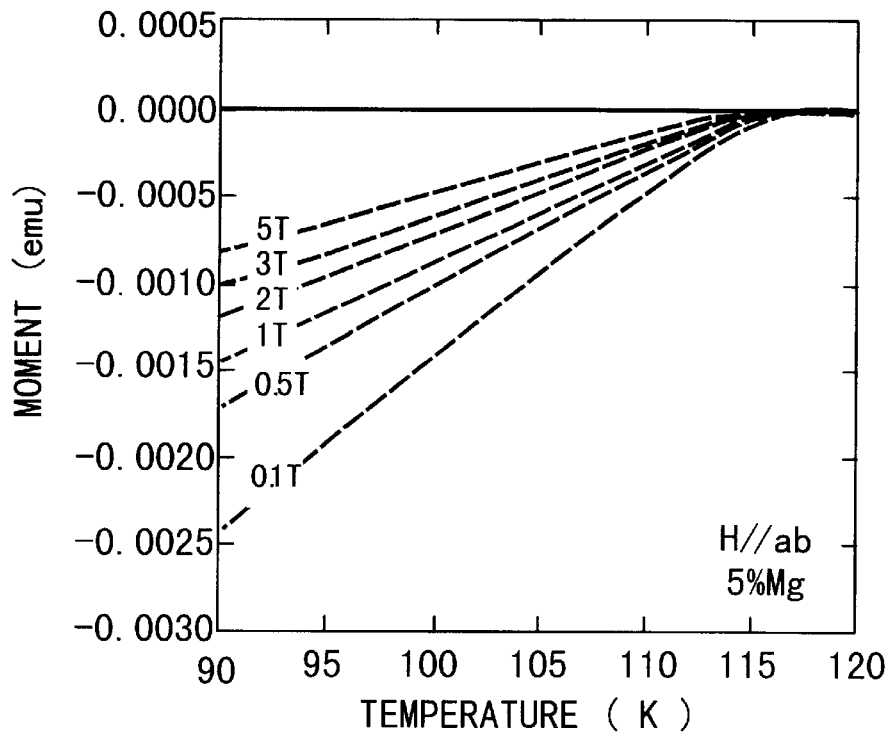
FIG. 4(a) is a diagram showing the relationship between temperature and magnetic field (0.1 to 5 T) in a non-oriented powder sample containing 5% Mg.
Figure 4B:
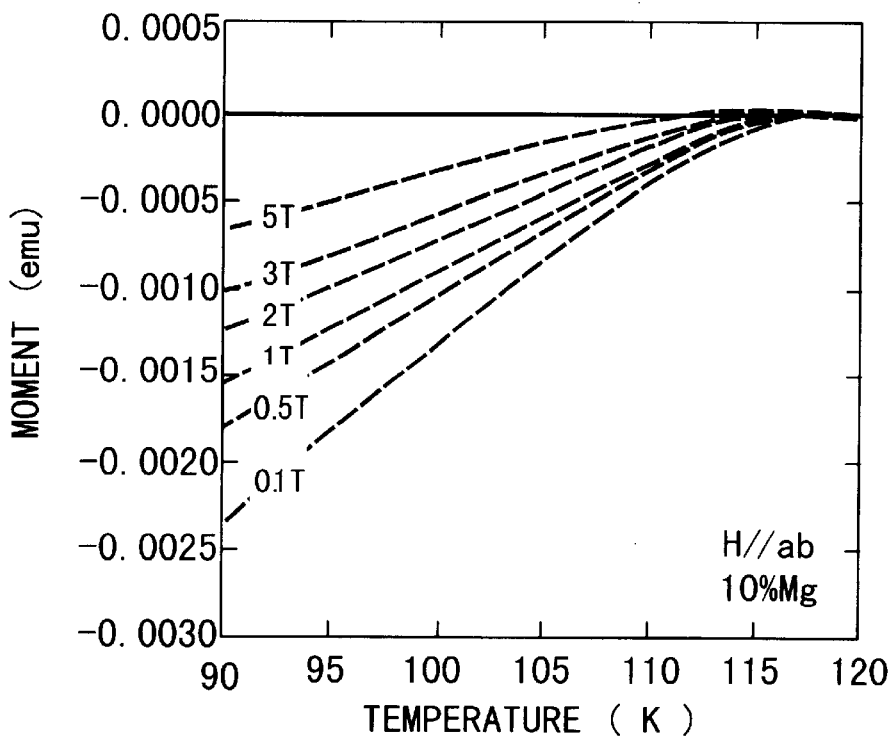
FIG. 4(b) is a diagram showing the relationship between temperature and magnetic field (0.1 to 5 T) in a non-oriented powder sample containing 10% Mg.
Figure 4C:
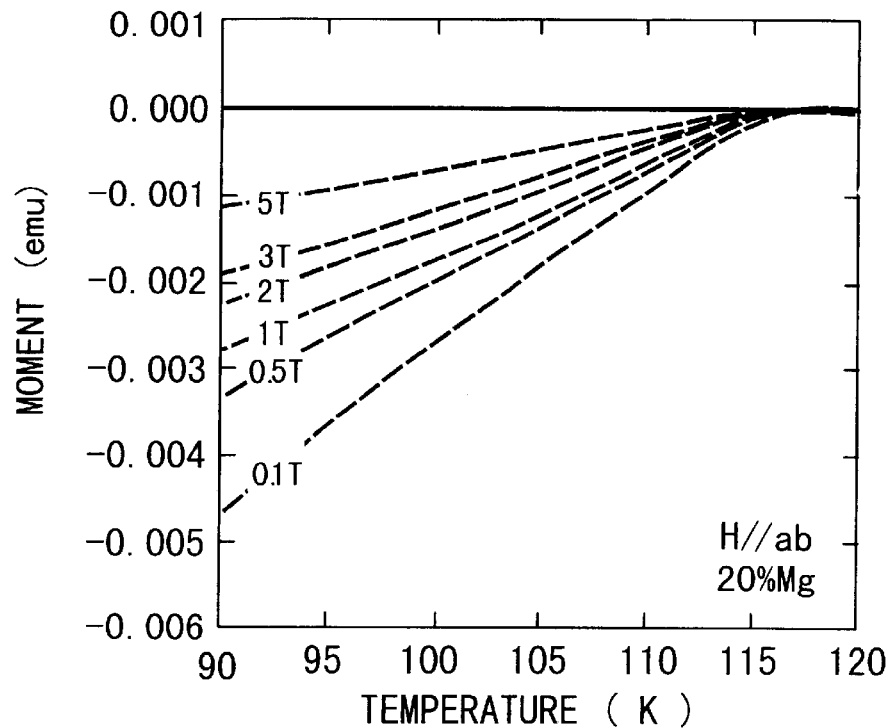
FIG. 4(c) is a diagram showing the relationship between temperature and magnetic field (0.1 to 5 T) in a non-oriented powder sample containing 20% Mg.
Figure 4D:
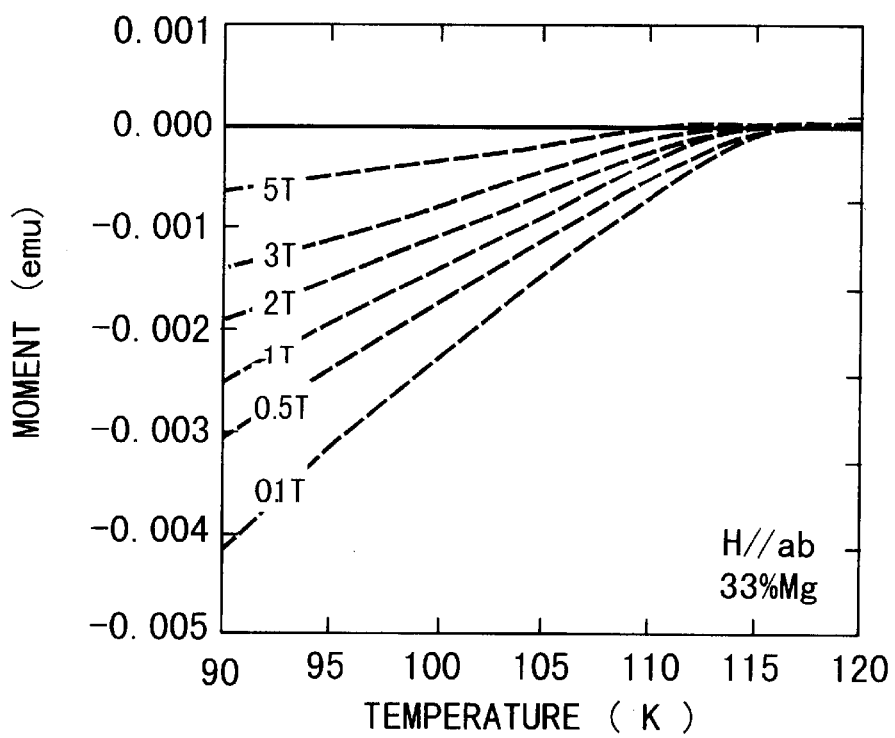
FIG. 4(d) is a diagram showing the relationship between temperature and magnetic field (0.1 to 5 T) in a non-oriented powder sample containing 33% Mg.
Figure 4E:
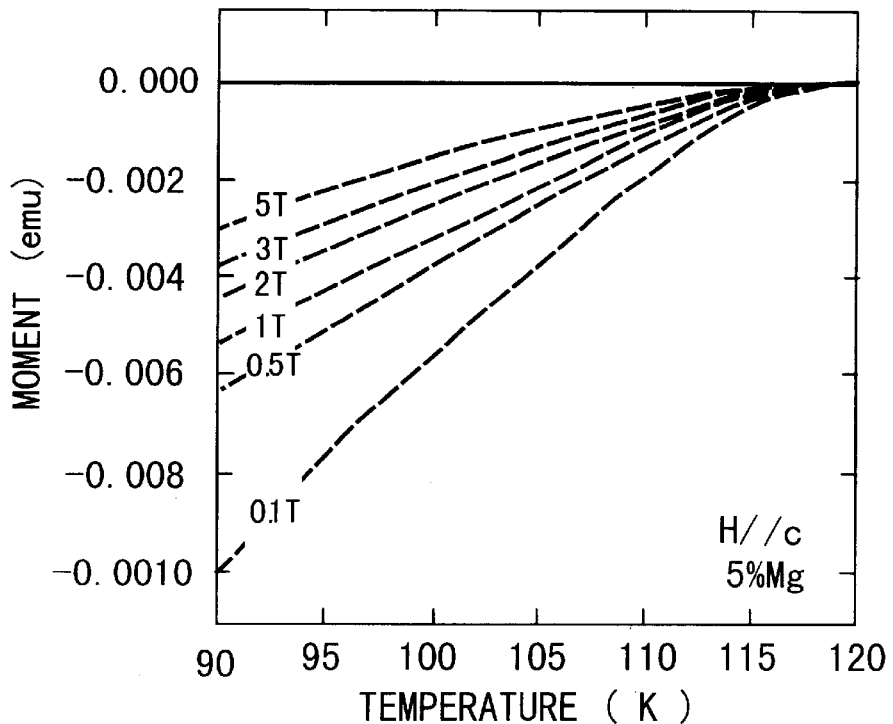
FIG. 4(e) is a diagram showing the relationship between temperature and magnetic field (0.1 to 5 T) in a powder sample containing 5% Mg that has been given a c-axis orientation.
Figure 4F:
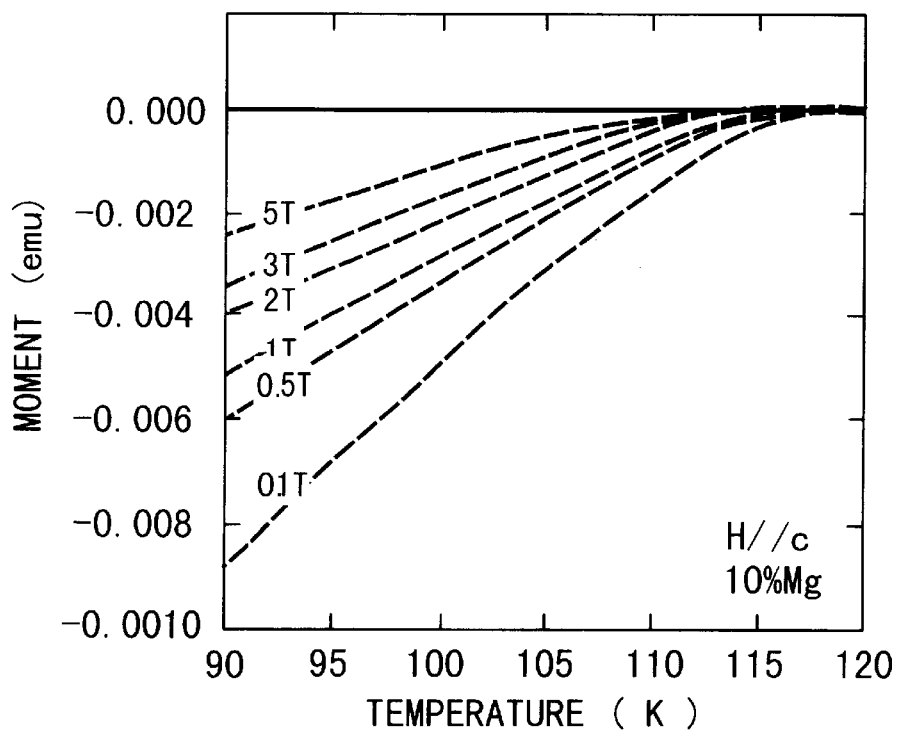
FIG. 4(f) is a diagram showing the relationship between temperature and magnetic field (0.1 to 5 T) in a powder sample containing 10% Mg that has been given a c-axis orientation.
Figure 4G:
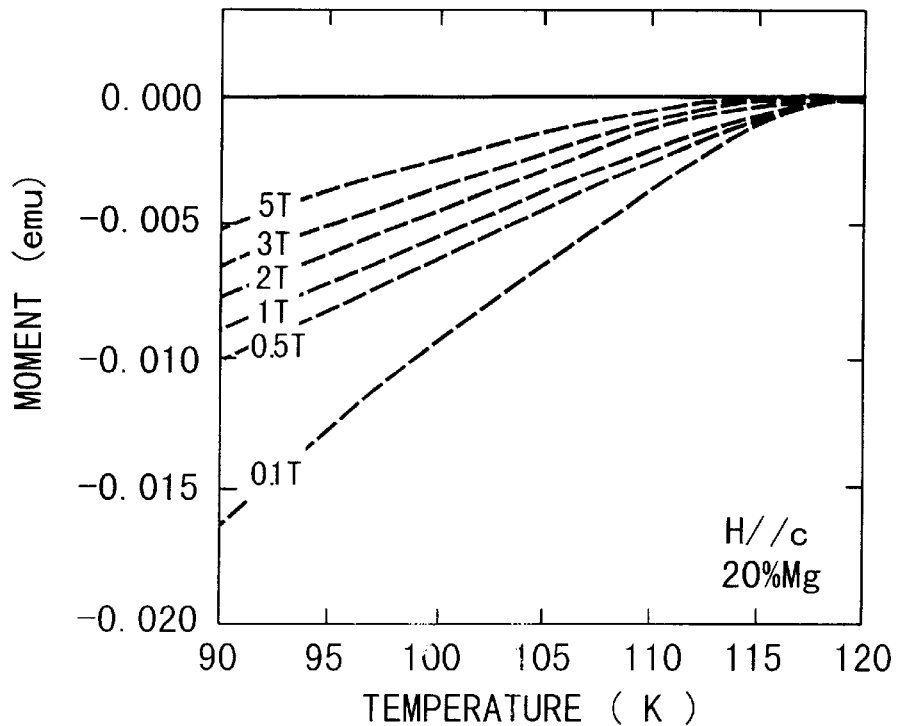
FIG. 4(g) is a diagram showing the relationship between temperature and magnetic field (0.1 to 5 T) in a powder sample containing 20% Mg that has been given a c-axis orientation.
Figure 4H:
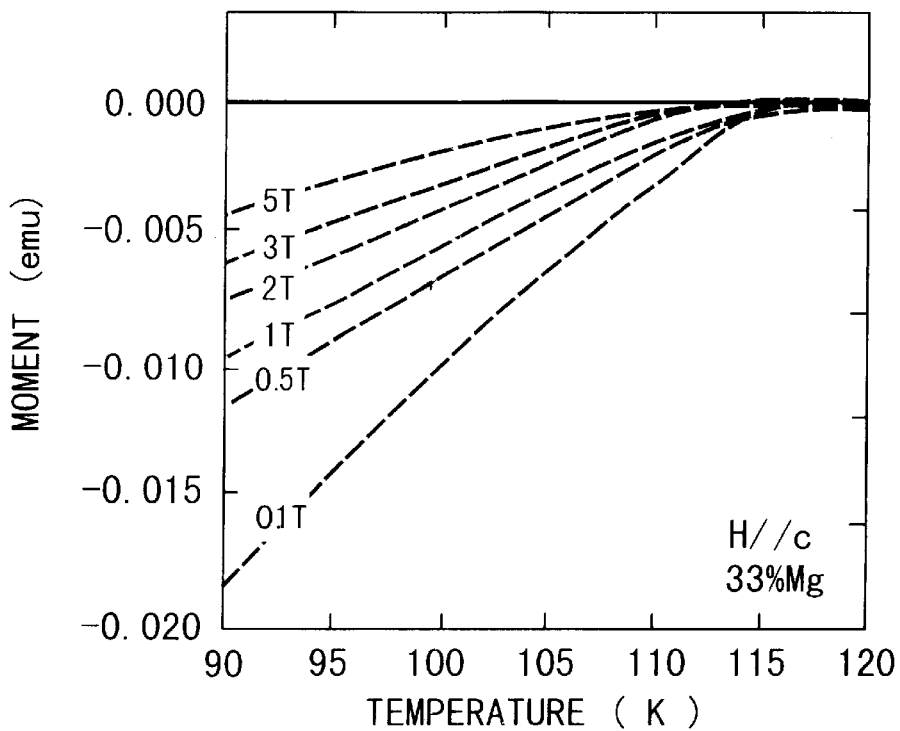
FIG. 4(h) is a diagram showing the relationship between temperature and magnetic field (0.1 to 5 T) in a powder sample containing 33% Mg that has been given a c-axis orientation.

FIGS. 2(a) and 2(b) are x-ray diffraction patterns of non-oriented and c-axis oriented powder samples of composition of $CuBa_2(Ca_{1-z}Mg_z)_3Cu_4O_{12-w}$ (z=0.05, 0.1, 0.2, 0.33)
With respect to the temperature-based changes in the electrical resistivity and magnetic susceptibility ratio of sintered samples In which z=0.05, 0.1, 0.2, 0.33, the samples exhibited a superconducting transition temperature Tc of 116 to 117 K (FIG. 3). FIGS. 4(a) to (h) show the relationship between temperature and magnetization of c-axis oriented powder samples under a magnetic field ranging from 0.1 to 5 T. The temperature dependency of the upper critical magnetic field $HC_2$ can be obtained from these diagrams.

Figure 5A:
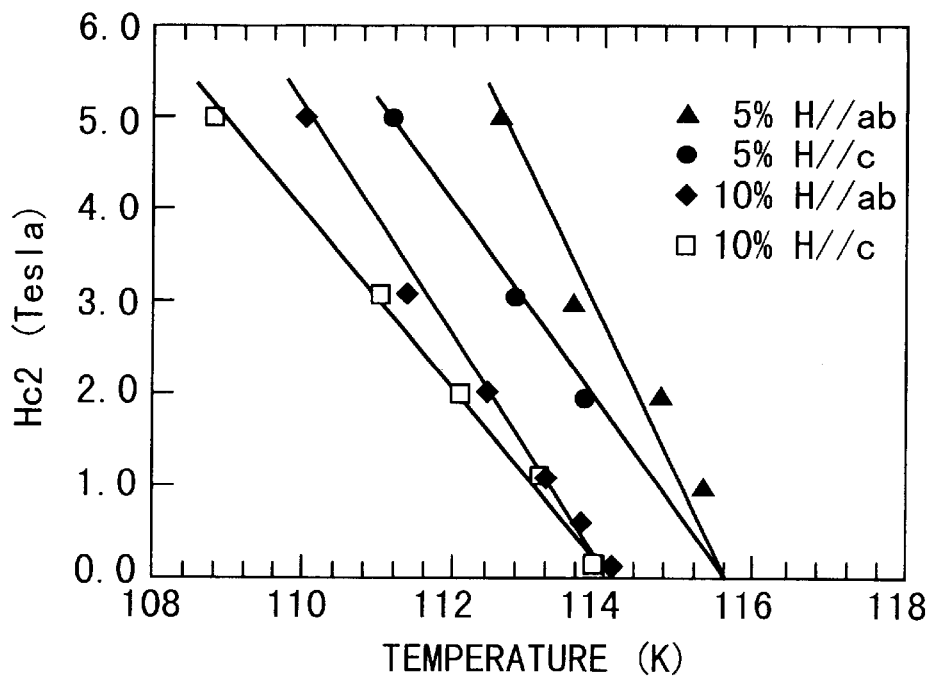
FIG. 5(a) is a diagram showing the temperature dependency of the upper critical magnetic field $Hc_2$ of powder samples containing 5% and 10% Mg.
Figure 5B:
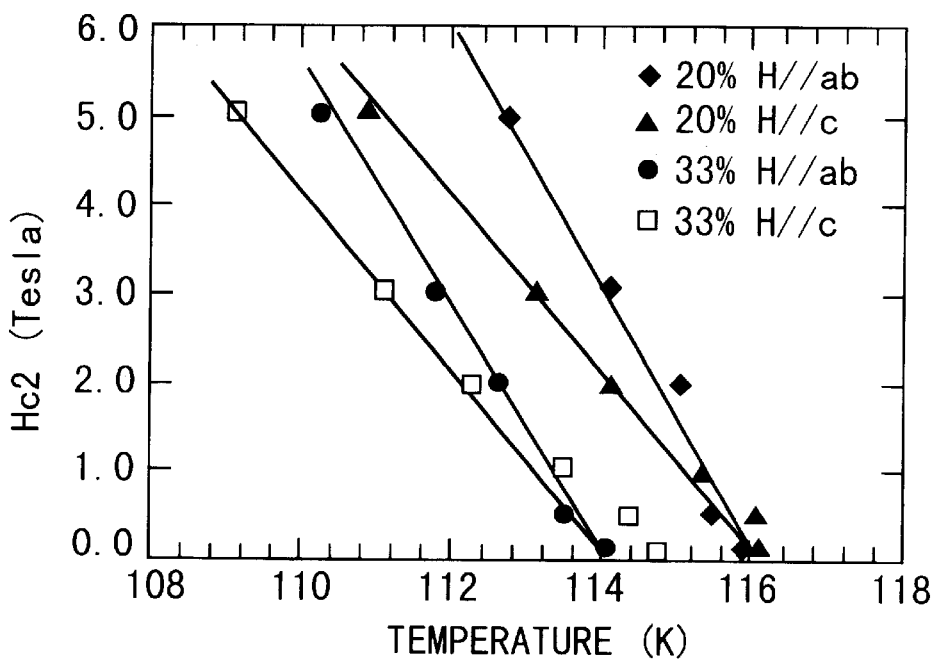
FIG. 5(b) is a diagram showing the temperature dependency of the upper critical magnetic field $Hc_2$ of powder samples containing 20% and 33% Mg.

FIG. 5 shows the temperature dependency of the upper critical magnetic field $Hc_2$ of each of the powder samples. Based on the slope of the line plots it is estimated that the anisotropy γ was 1.4. Table 1 lists the superconducting and other properties of the $CuBa_2(Ca_{1-z}Mg_z)_3Cu_4O_{12-w}$ (z=0.05, 0.1, 0.2, 0.33) samples.

Table 1 reveals that the samples had a Tc of 116 to 117 K, lattice parameters of a=3.855 to 3.847 Å, c=17.954 to 17.907 Å, a hole concentration of h=0.34 to 0.53 per $CuO_2$ plane, upper critical magnetic field of $(Hc_2)ab$=103 to 127 T, $(Hc_2)c$=74 to 86 T, coherence length of $\xi c$=13 to 14 Å, $\xi ab$=19 to 20 Å. and a superconducting anisotropy of γ=1.38 to 1.46.

Samples of Cu-1234 were prepared using as the starting material a mixture of the precursor of $Ba_2Ca_3Cu_4O_8$, CuO and MgO, and AgO as an oxidizer. The samples were All prepared by heating the mixtures for 1 to 3 hours at 900 to 1100° C. under a pressure of 3 GPa. The proportion of the Ca replaced by Mg can be adjusted by adjusting the composition of the MgO or by regulating the reaction temperature. Thickening of the superconducting layer can be achieved by increasing the concentration of Cu or Ca, increasing the synthesizing temperature or increasing the synthesizing time.

In accordance with this invention, a high-temperature superconductor was obtained having a low anisotropy of γ=1.4, which is close to isotropy and hitherto has been impossible to achieve. This makes it possible to develop materials with a higher Jc, materials with a higher irreversible field (Hirr), and superconducting materials with a long coherence length of $\xi c$=1.4 nm, materials suitable for Josephson junction devices having a layered structure, and high-temperature superconducting materials for practical use as wire, bulk and device materials.

Moreover, while the accepted wisdom has formerly been that a high Tc is closely related to high superconducting anisotropy, this accepted wisdom is overthrown by this invention, in accordance with which a high-temperature superconductor can be obtained having a superconducting anisotropy that is so low as to be close to isotropy. As such, the scientific impact of the invention is major, and it also provides an important indicator with respect to elucidating the mechanism of high temperature superconductivity.

What is claimed is:

1. A Mg-doped high-temperature superconductor, comprising a two dimensional layered structure constituted by a charge reservoir layer and a superconducting layer, wherein some or all atoms comprising the charge reservoir layer are Cu and O atoms, metallizing or rendering the charge reservoir layer superconducting, and a portion of Ca of $Cu_nCa_{n-1}O_{2n}$ constituting the superconducting layer is replaced by Mg, and comprises a copper oxide superconductor having a composition expressed by a formula $Cu_{1-x}M_x(Ba_{1-y}Sr_y)_2(Ca_{1-z}Mg_z)_{n-1}Cu_nO_{2n+4-w}$ (in which M is at least one selected from a group consisting of Tl, Hg, Bi, Pb, Au, In, Sn, Mg, Ag, Mo, Re, Os, Cr, V, Fe, and lanthanide elements, $0 \leq x<1$, $0 \leq y<1$, $0<z<1$, $0 \leq w \leq 4$, and $3 \leq n \leq 16$).

2. A superconductor according to claim 1, comprising a copper oxide superconductor having a composition expressed by a formula $Cu_{1-x}M_x(Ba_{1-y-m}Sr_yR_m)_2(Ca_{1-z}Mg_z)_{n-1}Cu_nO_{2n+4-w}$ (in which M is at least one selected

TABLE 1

| Sample | Tc (k) | a (Ű) | c (Ű) | $1/eR_H$ ($10^{21}/cm^3$) | $n_H$ (/$CuO_2$) | $H_{c2}^{ab}(0)$ (T) | $H_{c2}^{c}(0)$ (T) | $\xi_{ab}$ (Ű) | $\xi_c$ (Ű) | $g = \xi_{ab}/\xi_c$ |
|---|---|---|---|---|---|---|---|---|---|---|
| Cu-1234 | 117.5 | 3.856 | 17.993 | 5.40 | 0.36 | 195 | 121 | 16 | 10 | 1.6 |
| 5% Mg | 116.6 | 3.855 | 17.954 | 7.61 | 0.50 | 127 | 86 | 19 | 13.2 | 1.46 |
| 10% Mg | 116.4 | 3.848 | 17.907 | 7.05 | 0.47 | 103 | 74 | 20 | 14.2 | 1.41 |
| 20% Mg | 116.8 | 3.848 | 17.907 | 7.86 | 0.53 | 115 | 80 | 20 | 14 | 1.43 |
| 33% Mg | 116.6 | 3.847 | 17.917 | 5.19 | 0.34 | 110 | 79 | 20 | 14.5 | 1.38 | from a group consisting of Tl, Hg, Bi, Pb, Au, In, Sn, Mg, Ag, Mo, Re, Os, Cr, V, Fe, and lanthanide elements, R is at least one selected from the group consisting of La, Ce, Pr, Nd, Pm, Sm, Eu, Gd, Th, Dy, Ho, Er, Tm, Yb and Lu, with $0 \leq m < 1$, $0 \leq y+m \leq 1$, $0 \leq x < 1$, $0 \leq y < 1$, $0 < z < 1$, $0 \leq w \leq 4$, and $3 \leq n \leq 16$).

3. A Mg-doped high-temperature superconductor, comprising a two-dimensional layered structure constituted by a charge reservoir layer and a superconducting layer, wherein some or all atoms comprising the charge reservoir layer are Cu and O atoms, metallizing or rendering the charge reservoir layer superconducting, and a portion of Ca of $Cu_nCa_{n-1}O_{2n}$ constituting the superconducting layer is replaced by Mg, and comprises a copper oxide superconductor having a composition expressed by a formula $Cu_{1-x}M_x(Ba_{1-y}Sr_y)_2(Ca_{1-z}Mg_z)_{n-1}Cu_nO_{2n+4-w}$ (in which M is at least one selected from a group consisting of Tl, Hg, Pb, In, Sn, Mg, Ag, Mo, Cr, V, and Fe, $0 \leq x < 1$, $0 \leq y < 1$, $0 < z < 1$, $0 \leq w \leq 4$, and $3 \leq n \leq 16$).

4. A superconductor according to claim 3, comprising a copper oxide superconductor having a composition expressed by a formula $Cu_{1-x}M_x(Ba_{1-y-m}Sr_yR_m)_2(Ca_{1-z}Mg_z)_{n-1}Cu_nO_{2n+4-w}$ (in which R is at least one selected from the group consisting of La, Ce, Nd, Sm, Gd, and Lu, with $0 \leq m < 1$, $0 \leq y+m \leq 1$, $0 \leq x < 1$, $0 \leq y < 1$, $0 < z < 1$, $0 \leq w \leq 4$, and $3 \leq n \leq 16$).

* * * * *

UNITED STATES PATENT AND TRADEMARK OFFICE
CERTIFICATE OF CORRECTION

PATENT NO. : 6,281,171 B1
DATED : August 28, 2001
INVENTOR(S) : Ihara et al.

Page 1 of 1

It is certified that error appears in the above-identified patent and that said Letters Patent is hereby corrected as shown below:

Title page, Item [54], and Column 1, lines 1-5,
The title should be:
-- [54] MG-DOPED HIGH-TEMPERATURE SUPERCONDUCTOR HAVING LOW SUPERCONDUCTING ANISOTROPY AND METHOD FOR PRODUCING THE SUPERCONDUCTOR --

Signed and Sealed this

Twenty-third Day of April, 2002

*Attest:*

JAMES E. ROGAN
*Attesting Officer*   *Director of the United States Patent and Trademark Office*